United States Patent [19]
Voorman et al.

[11] Patent Number: 5,559,646
[45] Date of Patent: Sep. 24, 1996

[54] BALANCED ARRANGEMENT FOR READING INFORMATION FROM A TRACK ON A RECORD CARRIER WHICH ARRANGEMENT INCLUDES AMPLIFIER CIRCUITS CONTAINING CUT-OFF CAPACITORS WHICH ARE CROSS-COUPLED TO REDUCE NOISE

[75] Inventors: Johannes O. Voorman; Joao N. V. L. Ramalho, both of Eindhoven, Netherlands

[73] Assignee: U.S. Philips Corporation, New York, N.Y.

[21] Appl. No.: 318,302

[22] Filed: Oct. 5, 1994

[30] Foreign Application Priority Data

Oct. 6, 1993 [EP] European Pat. Off. .............. 93202836
Jun. 23, 1994 [EP] European Pat. Off. .............. 94201804

[51] Int. Cl.⁶ ..................................... G11B 5/02
[52] U.S. Cl. ............................. 360/67; 360/66
[58] Field of Search ................... 360/46, 67, 68, 360/66

[56] References Cited

U.S. PATENT DOCUMENTS

| | | | |
|---|---|---|---|
| 5,103,353 | 4/1992 | Jove et al. | 360/67 |
| 5,204,789 | 4/1993 | Jove et al. | 360/67 |
| 5,270,882 | 12/1993 | Jove et al. | 360/67 |
| 5,345,346 | 9/1994 | Brannon et al. | 360/67 |
| 5,426,542 | 6/1995 | Smith | 360/67 |

*Primary Examiner*—W. Chris Kim
*Attorney, Agent, or Firm*—Richard A. Weiss

[57] ABSTRACT

An arrangement for reading out an information signal from a magnetic record carrier. The arrangement includes a read head having a magneto-resistive element with a first terminal connected to a first point of constant potential, and a second terminal; a bias-current generator having an output for supplying a bias-current to the MR element and an amplifier circuit having a first terminal coupled to the output of the bias-current generator, and a second terminal coupled to the second terminal of the MR so as to form a series arrangement of the bias-current generator, the amplifier circuit and the MR element. At an output terminal of the amplifier circuit, the information signal is available. The amplifier circuit includes a MOS transistor connected between the output terminal and the second terminal; and a feedback circuit, including a resistor and a capacitor, having a low cut-off frequency which provides a bias voltage to the gate of the MOS transistor and forces the entire bias-current of the bias-current generator to flow through the MR element. The arrangement is balanced with an additional MR element (optional), bias-current generator and amplifier circuit, which are substantially the same as the MR element, bias-current generator and amplifier circuit, respectively, with the cut-off capacitors of the two individual amplifiers being cross-coupled to reduce noise.

31 Claims, 9 Drawing Sheets

BALANCED ARRANGEMENT FOR READING INFORMATION FROM A TRACK ON A RECORD CARRIER WHICH ARRANGEMENT INCLUDES AMPLIFIER CIRCUITS CONTAINING CUT-OFF CAPACITORS WHICH ARE CROSS-COUPLED TO REDUCE NOISE

BACKGROUND OF THE INVENTION

The invention relates to an arrangement for reading out an information signal from a magnetic record carrier, comprising:

(a) a read head having a magneto-resistive element with a first terminal connected to a first point of constant potential, and with a second terminal;

(b) a first bias-current generator for supplying a bias-current; and (c) a first amplifier circuit having (i) an output terminal for supplying the information signal, (ii) a first terminal coupled to the first bias-current generator and to the output terminal, (iii) a second terminal coupled to the second terminal of the magneto-resistive element so as to form a series arrangement of the first bias-current generator, the first amplifier circuit and the magneto-resistive element between a second point of constant potential and the first point of constant potential, (iv) a first transistor, (iv) a first feedback circuit, (vii) a first load impedance and (vii) a first capacitor element, a first main flow terminal of the first transistor being connected to the second terminal of the first amplifier circuit, a second main flow terminal of the first transistor being coupled to the first terminal of the first amplifier circuit, a control terminal of the first transistor being coupled to the output terminal of the first amplifier circuit via the first feedback circuit, and the first load impedance being coupled between the output terminal of the first amplifier circuit and a reference voltage terminal.

Such an arrangement is known from U.S. Pat. No. 5,270,882. In this known arrangement, current biasing and current sensing of tile magneto-resistive element is combined, thereby providing a low-noise amplification.

SUMMARY OF THE INVENTION

It is an object of the invention to improve the noise behavior of the known arrangement. In accordance with an aspect of the invention, the known arrangement is characterized in that it further comprises:

(d) a second bias-current generator for supplying a bias-current; and (e) a second amplifier circuit having (i) an output terminal, (ii) a first terminal coupled to the second bias-current generator and to the output terminal, (iii) a second terminal coupled to the first point of constant potential, optionally via a further magneto-resistive element, so as to form a series arrangement of the second bias-current generator, the second amplifier circuit and further magneto-resistive element between the second point of constant potential and the first point of constant potential, (iv) a second transistor, (v) a second feedback circuit, (vi) a second load impedance and (vii) a second capacitor element, a first main flow terminal of the second transistor being connected to the second terminal of the second amplifier circuit, a second main flow terminal of the second transistor being coupled to the first terminal of the second amplifier circuit, a control terminal of the second transistor being coupled to the output terminal of the second amplifier circuit via the second feedback circuit, the second load impedance being coupled between the output terminal of the second amplifier circuit and a reference voltage terminal. Furthermore, the control terminal of the second transistor is coupled to the second terminal of the first amplifier circuit via the second capacitor element, and the control terminal of the first transistor is coupled to the second terminal of the second amplifier circuit via the first capacitor element.

The arrangement according to the invention provides a balanced version of the known arrangement wherein the first and second capacitor elements are cross-coupled to the second terminals of the individual amplifiers instead of to ground. The cross-coupling causes a shunting of the noise resistances of the first and second transistors and effects a reduced noise contribution of the first and second transistors.

A further noise reduction is obtained in an arrangement which is characterized in that (a) the first terminal of the first amplifier circuit is coupled to the output terminal of the first amplifier circuit via a cascode transistor having a first main flow terminal connected to the first terminal of the first amplifier circuit and a second main flow terminal coupled to the output terminal of the first amplifier circuit, and (b) the first terminal of the second amplifier circuit is coupled to the output terminal of the second amplifier circuit via a cascode transistor having an first main flow terminal connected to the first terminal of the second amplifier circuit and a second main flow terminal coupled to the output terminal of the second amplifier circuit.

In order to obtain low noise, the first and second transistors should be large. By cascoding these large transistors the following advantages are obtained. The large first and second transistors and the first and second bias current generators can have a low output impedance, since they feed their respective currents into a very low-ohmic emitter of the cascode transistor. The drain-to-gate capacitance of the large first and second transistors is not Millered. The first and second bias current generators provide lower bias current and a corresponding lower noise because part of the total bias current for the magneto-resistive element is provided by the parallel arranged cascode transistor. The bias current generators feed current to a low voltage node, so that a maximum voltage range is available for the bias-current source, so as to enable the bias-current generator to be optimal for low noise, for example, by using a current source transistor with a large emitter degeneration resistor.

BRIEF DESCRIPTION OF THE DRAWING

The above and other features and advantages of the invention will be apparent from the following description of exemplary embodiments of the invention with reference to the accompanying drawings, in which.

(Like reference symbols are employed in the drawings and in the description of the preferred embodiments to represent the same or very similar item or items.)

DETAILED DESCRIPTION OF THE PREFERRED EMBODIMENTS

Figure 1:
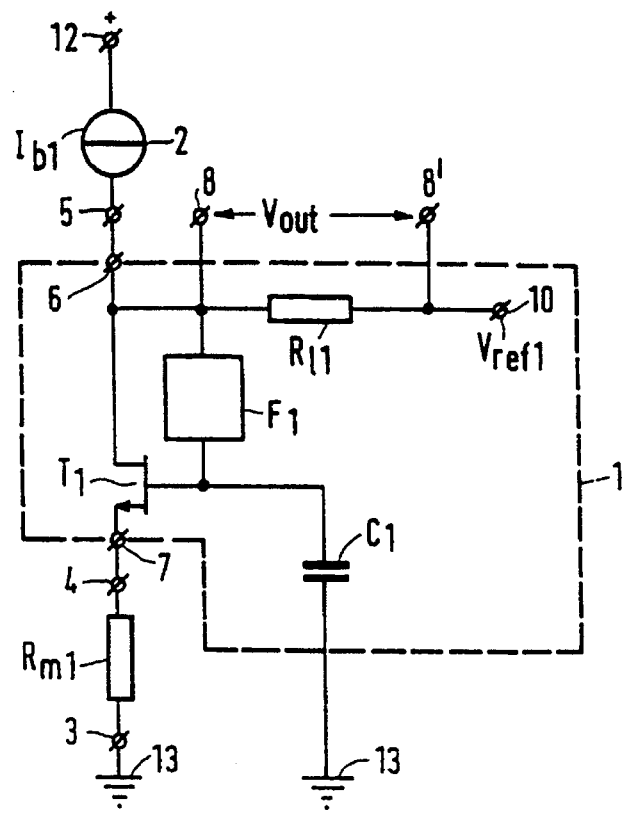
FIG. 1 shows a known arrangement for reading information from a track on a record carrier.

FIG. 1 shows the basic circuit construction of the arrangement known from U.S. Pat. No. 5,270,882, which comprises a read head (not shown) having a magneto-resistive (MR) element $R_{m1}$, a bias-current generator 2 for generating a bias-current $I_{b1}$ and an amplifier circuit 1. A first terminal 3 of the magneto-resistive element $R_{m1}$ is connected to a first point of constant potential 13, which is ground potential. An output 5 of the bias-current generator 2 is coupled to a first terminal 6 of the amplifier circuit 1. A second terminal of the bias-current generator 2 is coupled to a second point of constant potential 12 (the positive supply voltage, denoted by +). A second terminal 7 of the amplifier circuit 1 is coupled to a second terminal 4 of the magneto-resistive element $R_{m1}$. An output terminal 8,8' is available for supplying the information signal read out.

The amplifier circuit 1 comprises a transistor $T_1$, a feedback circuit $F_1$ and a capacitor element $C_1$. The transistor $T_1$ is in the form of a MOSFET or a jFET. Its source terminal is coupled to the second terminal 7 of the amplifier circuit 1. Its drain terminal is coupled to the first terminal 6 of the amplifier circuit 1. Its gate terminal is coupled to the point of constant potential 13, via the capacitor element $C_1$. Further, the feedback circuit $F_1$ is coupled between the gate of the transistor $T_1$ and the terminal 6 of the amplifier circuit 1. The drain terminal of the transistor $T_1$ is further coupled to a reference point 10 via a load impedance $R_l$. At the reference point 10, a voltage $V_{ref}$ is available, which needs not be a constant potential, but may vary, as will be explained later. At output terminal 8,8' the voltage occurring over the load impedance $R_l$ is present. The bias-current generator 2, the amplifier circuit 1, more specifically the transistor $T_1$ in the amplifier circuit 1, and the MR element $R_{m1}$ form a series arrangement between the terminals 3 and 12.

As can be seen from the figure, the MR element $R_{m1}$ is connected to ground via its terminal 3. Further, when used in an arrangement for reading an information signal from a disk shaped record carrier (not shown), the disk is also preferably electrically connected to ground. This limits the possibility that a voltage difference can be built up between the head and the disk. This avoids electrical discharges that could otherwise occur between head and disk, which discharges could damage the head.

As previously stated, the MR element $R_{m1}$, the amplifier 1 and the bias-current generator 2 form a series arrangement between the two (supply) terminals 3 and 12. Thus, the current supplied by the bias-current generator 2 is fed to the MR element $R_{m1}$ so as to bias the MR element, as well as to the amplifier circuit 1. This bias current through the amplifier circuit 1 results in a certain noise contribution, which is lower when the current through the amplifier circuit is higher. If the amplifier circuit 1 were in parallel with the MR element $R_{m1}$ and the bias-current generator 2, a larger current would be needed to bias the MR element and to supply the input stage of the amplifier circuit with the current needed to obtain a low noise contribution in the amplifier circuit. Thus the arrangement of FIG. 1 produces less noise and requires less bias current, which is a major advantage in the case of battery powered supply voltages.

When the amplifier circuit 1 has only one transistor, such as in the embodiment of FIG. 1, instead of two in the case of a long-tailed pair, the amplifier circuit has a lower noise contribution.

Variations in the magnetic field detected by the MR element $R_{m1}$ lead to variations in the resistance value of the MR element. The gate of transistor $T_1$ is coupled to ground for AC signals by means of the capacitor $C_1$. This means that for AC signals, the terminal 4 of the MR element $R_{m1}$ lies virtually to ground. As a result of this, variations in the resistance value of the MR element can only lead to variations in the current through the series arrangement. These current variations are fed via the load impedance $R_{l1}$ to the terminal 10, and lead to a voltage variation across the load impedance $R_{l1}$. This voltage variation is detected at the terminals 8,8' as the output signal of the amplifier circuit 1.

The feedback circuit $F_1$ realizes a low cut-off frequency. In order to enable integration of the capacitor $C_1$, the resistance value of $F_1$ should be high. This results in the transistor $T_1$ acting like a diode for DC signals, so that the bias-current $I_{b1}$ can be fed to the MR element $R_{m1}$. The feedback circuit $F_1$ is an impedance network. In its most simple form, the feedback circuit $F_1$ can be a resistor.

In order to make the arrangement of FIG. 1 suitable for use at low supply voltages applied between the terminals 3 and 12, it is necessary to make the voltage drop between the terminals 4 and 6 as small as possible, so that a maximum voltage range is available for the bias-current source 2, so as to enable the bias-current source to be optimal for low noise.

Figure 2A:
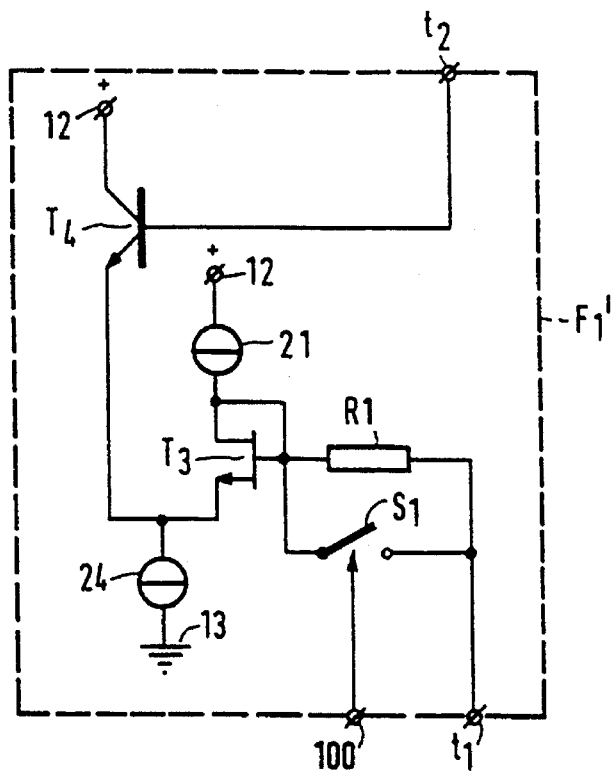
FIGS. 2A, 2B, 2C show versions of a feedback circuit for use in the arrangement of FIG. 1.

FIG. 2A shows an elaborated version of the feedback circuit $F_1$, feedback circuit $F_1'$, so as to make it high ohmic and to realize a voltage drop across the transistor $T_1$ which is as small as possible. The feedback circuit $F_1$ comprises a transistor $T_3$, which is a MOS transistor, a bipolar transistor $T_4$ and a resistor $R_1$. Both transistors $T_1$ and $T_3$ are of the same type, MOSFET or jFET. The gate terminal of the transistor $T_1$ is coupled to the terminal $t_1$ of the feedback circuit $F_1'$. The terminal $t_1$ is coupled to the gate terminal of the third transistor $T_3$ via the resistor $R_1$. The source terminal of the third transistor $T_3$ is coupled to the emitter terminal of the fourth transistor $T_4$. The base terminal of the transistor $T_4$ is coupled to the terminal $t_2$ of the feedback circuit $F_1'$, which terminal is coupled to the terminal 6 of the amplifier circuit 1. The gate and drain terminals of the transistor $T_3$ are interconnected so as to form a diode. Further, the interconnected gate and drain terminals are coupled to the point 12 of constant potential via a current source 21. The emitter of the transistor $T_4$ is coupled to the point of constant potential 13 via a current source 24. Further, the collector of the transistor $T_4$ is coupled to the point of constant potential 12. The current sources provide current supply for the transistors $T_3$ and $T_4$.

By means of the feedback part of FIG. 2A, a voltage shift of $-V_{th}+V_d$ is obtained between the terminals $t_1$ and $t_2$, where $V_{th}$ is the threshold voltage of a MOS transistor, such as the transistors $T_1$ and $T_3$, and $V_d$ is the voltage across a bipolar diode. As a result, the voltage difference between the terminals 6 and 7 of the amplifier circuit 1 of FIG. 1 is roughly $V_d$, or substantially 0.7 V.

More specifically, the voltage difference between the terminals 6 and 7 is $V_d+V_{ch1}-V_{ch2}$, where $V_{ch1}$ and $V_{ch2}$ are the channel voltages of the transistors $T_1$ and $T_3$, respectively, which are dependent of the drain current through those transistors ($V_{ch}=V_{gs}-V_{th}$, where $V_{gs}$ is the gate-source voltage and $V_{th}$ is the threshold voltage of a transistor).

Further, the impedance formed by the feedback circuit $F_1'$ between the terminals $t_1$ and $t_2$ is high-ohmic so as to obtain the desired low value for the cut-off frequency of the lower band edge of the frequency characteristic of the amplifier circuit 1. The circuit of FIG. 2A has current sources coupled to both the positive (12) and the negative (13) supply voltage terminals.

Figure 2B:
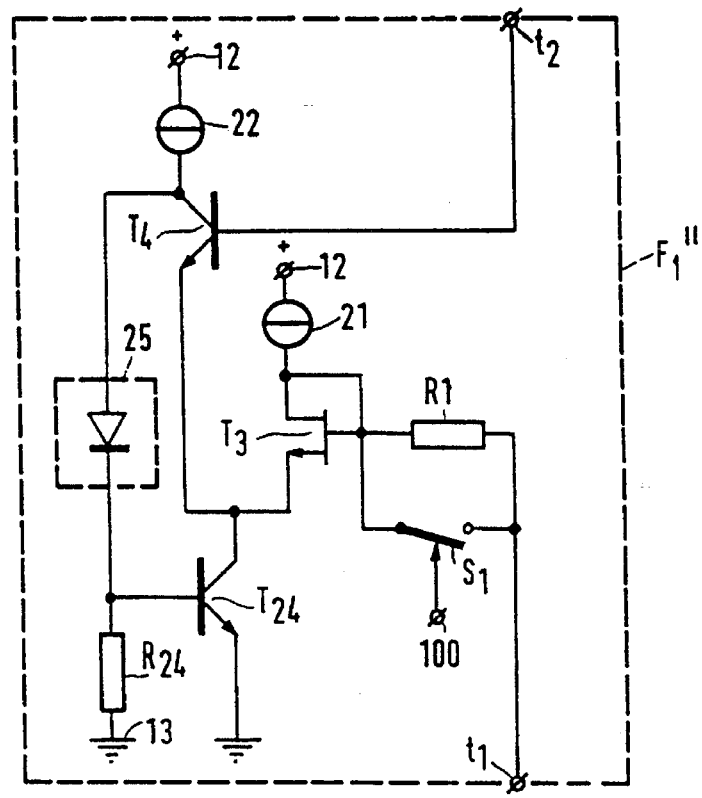

FIG. 2B shows a further elaborated version of the feedback circuit of FIG. 2A, feedback circuit $F_1''$, which has current sources connected to the positive supply terminal only. In addition to the elements included in the circuit of FIG. 2A, except for the current source 24 (which is replaced by other elements as described hereinafter), the circuit of FIG. 2B further comprises a diode arrangement 25 of one or more diodes, a bipolar transistor $T_{24}$, a current source 22 and a resistor $R_{24}$. The current source 22 is coupled between the point 12 of constant potential and the collector of the transistor $T_4$, and is further coupled via the diode arrangement 25 to the base terminal of the transistor $T_{24}$. The base terminal of the transistor $T_{24}$ is also coupled to the point 13 of constant potential via the resistor $R_{24}$. The emitter of the transistor $T_{24}$ is also coupled to the point 13 of constant potential, and its collector is coupled to the interconnected emitter and source of the transistors $T_4$ and $T_3$, respectively. The circuit part formed by the elements 22, 25, $R_{24}$ and $T_{24}$ effectively replaces the current source 24 in FIG. 2A.

The circuits of the FIGS. 2A and 2B further show a switch $S_1$ connected in parallel to the resistor $R_1$. When activating the amplifier circuit 1 of FIG. 1, or when the current value through the MR element $R_{m1}$ should be changed, the capacitor $C_1$ must initially be charged (or discharged) so that the amplifier circuit can settle to the new situation. In order to settle fast, the resistor $R_1$ is short-circuited by the switch $S_1$ under the influence of a switching signal applied to the control signal input 100, so that the current for charging the capacitor $C_1$ can be supplied by the current source 21, or discharging can take place via the current source 24. Thus, the charging time of the capacitor $C_1$ is limited by the maximum current that can be supplied by the current source 21, and the discharging time is limited by the maximum current that can be received by the current source 24. Replacing the current source 24 of FIG. 2A by the elements 22, 25, $R_{24}$ and $T_{24}$ in FIG. 2B already offers a shortening of the discharge time, as the transistor $T_{24}$ can sink currents which are up to two orders of magnitude larger than the current through the current source 22.

Figure 2C:
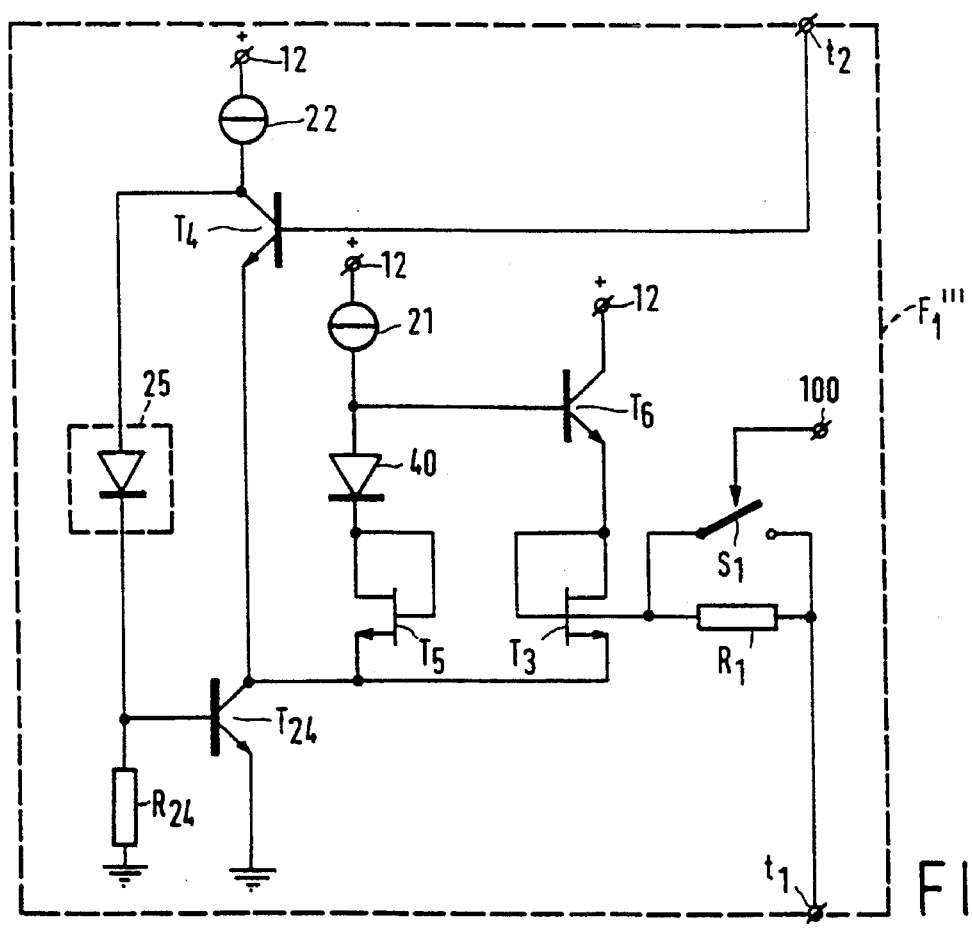

FIG. 2C shows a feedback circuit $F_1'''$ in which the charging time of the capacitor $C_1$ can be shortened. In addition to the elements included in the circuit of FIG. 2B, the circuit of FIG. 2C further comprises a MOS transistor $T_5$, a bipolar transistor $T_6$ and a bipolar diode element 40. The gate and drain terminals of the transistor $T_5$ are interconnected and both coupled to the current source 21 and to a base terminal of the transistor $T_6$ via the diode element 40. The source terminals of the transistors $T_3$ and $T_5$ are interconnected. A collector terminal of the transistor $T_6$ is coupled to point 12 of constant potential. An emitter terminal of the transistor $T_6$ is coupled to the interconnected gate and drain terminals of the transistor $T_3$. The circuit comprising the transistors $T_3$, $T_6$ and $T_5$ and the diode element 40 form a class-A/B circuit and provides a quicker charging of the capacitor element $C_1$ during initialisation of the arrangement by means of current supplied by the transistor $T_6$.

Figure 3A:
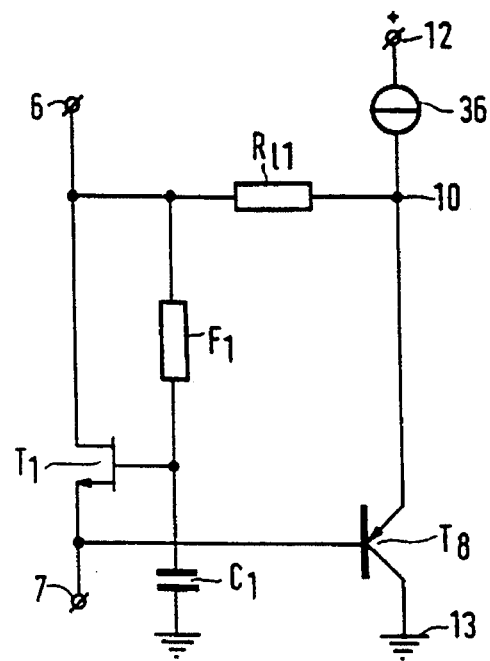
FIGS. 3A, 3B, 4A, 4B and 5 show versions of an amplifier circuit for use in the arrangement of FIG. 1.

FIG. 3A shows a further-elaborated version of the amplifier circuit 1 of FIG. 1. The circuit of FIG. 3A comprises a bipolar transistor $T_8$, which has its base terminal coupled to the source terminal of the transistor $T_1$, its collector to the point 13 of constant potential, and its emitter coupled to the reference point 10. Further a current source 36 is coupled between the reference point 10 and the second point 12 of constant potential. This circuit has the advantage that the DC voltage present at the reference point 10 follows the DC voltage present at the terminal 7 of the amplifier circuit. This means that voltage variations occurring across the MR element $R_{m1}$ do not appear across the load resistor $R_{l1}$.

The voltage difference between the terminals 7 and 10 is equal to $V_d$. If $F_1$ is one of the circuits of the FIGS. 2A, B or 2C, the voltage difference between the terminals 6 and 7 equals $V_d+V_{ch1}-V_{ch2}$, see above, so that the DC offset across the load resistor $R_{l1}$ is low ($V_{ch1}-V_{ch2}$). Only voltage variations in the transistor $T_1$, resulting from the current variations through the transistor $T_1$, still appear across the load resistor $R_{l1}$.

Figure 3B:
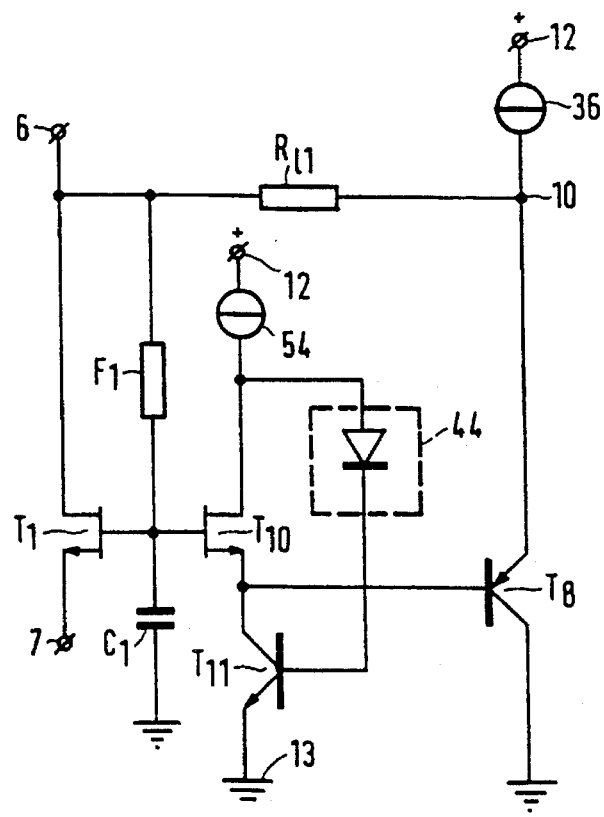

A further improvement of the amplifier circuit of FIG. 3A is disclosed in FIG. 3B. In addition to the elements included in the circuit of FIG. 3A, this amplifier circuit further has a MOS transistor $T_{10}$ and a bipolar transistor $T_{11}$. The gate of transistor $T_{10}$ is connected to the gate of the transistor $T_1$. The drain of transistor $T_{10}$ is coupled to the point 12 of constant potential via a current source 54, as well as coupled to the base of the transistor $T_{11}$ via a diode arrangement 44 having one or more series connected diodes. The source of the transistor $T_{10}$ is coupled to the collector of the transistor $T_{11}$, as well as to the base of the transistor $T_8$. The emitter of the transistor $T_{11}$ is coupled to the point 13 of constant potential.

The voltage difference between the gate of the transistor $T_1$ and the terminal 10 equals $V_{gs}-V_d$, where $V_{gs}$ is the gate-source voltage of the transistor $T_{10}$. If $F_1$ is again one of the circuits of the FIGS. 2A, 2B or 2C, the voltage difference between the gate of the transistor $T_1$ and terminal 6 equals $V_{gs}'-V_d$, where $V_{gs}'$ is the gate-source voltage of the transistor $T_3$. The voltage across the load resistor $R_{l1}$ now equals $V_{gs}'-V_{gs}$. If the current through transistor $T_{10}$ is made equal to the current through the transistor $T_3$, and further the transistors $T_{10}$ and $T_3$ have equal dimensions, the voltage across the load resistor $R_{R1}$ becomes practically zero, independent of the value of the MR bias current.

It will be clear that, instead of the combination of the current source 54, the diode arrangement 44 and the transistor $T_{11}$, a current source could have been coupled between the emitter of the transistor $T_{11}$ and ground potential.

Figure 4A:
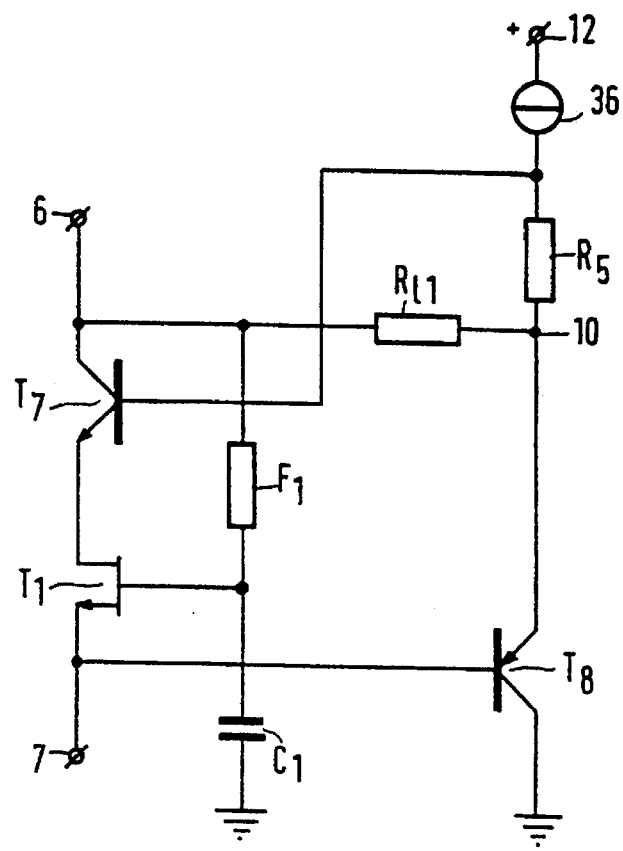

FIG. 4A shows a further improvement of the amplifier circuit of FIG. 3A. The amplifier circuit of FIG. 4A, in addition to the elements included in the circuit of FIG. 3A, comprises a bipolar transistor $T_7$ which is coupled between the drain terminal of the transistor $T_1$ and the terminal 6. The base terminal of transistor $T_7$ is coupled to the point 12 of constant potential via the current source 36, and to the point 10 via a resistor $R_5$. By means of the transistor $T_7$, the transistor $T_1$ is cascoded in order to get a higher output impedance at the terminal 6 and to prevent the Millering of the drain-gate capacitance of transistor $T_1$.

Figure 4B:
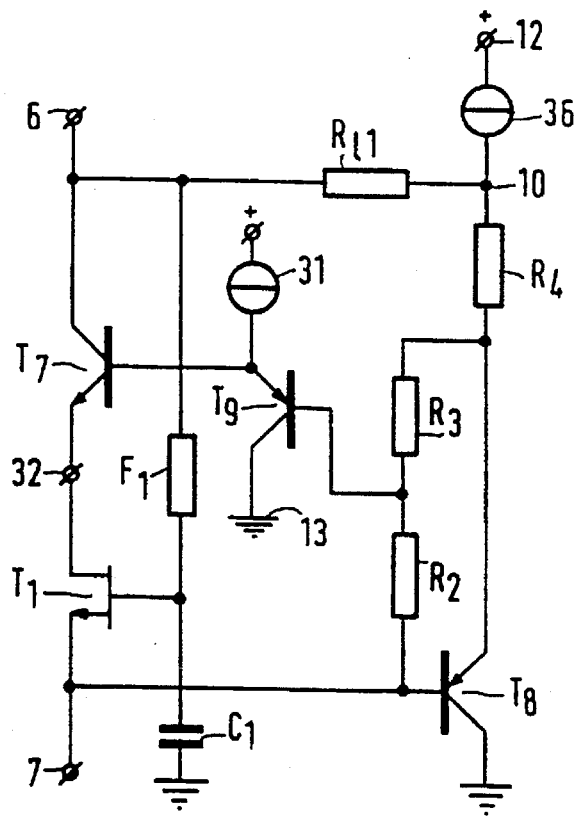

FIG. 4B shows an alternative of the amplifier circuit of FIG. 4A. It additionally comprises a transistor $T_9$, resistors $R_2$, $R_3$ and $R_4$ and a current source 31. The base terminal of the transistor $T_7$ is connected to an emitter terminal of the transistor $T_9$, whose base terminal is coupled to the source terminal of the transistor $T_1$ via the resistor $R_2$. The collector of the transistor $T_9$ is coupled to the point 13 of constant potential. The emitter of the transistor $T_9$ is further coupled to the point 12 of constant potential via the current source 31. The base of the transistor $T_9$ is also coupled to the emitter of the transistor $T_8$ via the resistor $R_3$, and to the reference point 10 via the resistors $R_3$ and $R_4$.

Further, the construction of the transistors $T_7$ and $T_9$ provide a voltage at the interconnection node 32 of the emitter of transistor $T_7$ and the drain of transistor $T_1$ which is roughly half way between the voltages present on the terminals 7 and 6. This means that a voltage difference of $V_d/2$ is present between the node 32 and the terminal 7, and between the nodes 32 and the terminal 6, as the voltage difference between the terminals 6 and 7 is $V_d$, as explained previously.

It should be noted that FIG. 4A and FIG. 4B are derived from FIG. 3A by adding the cascode transistor $T_7$, using different biasing schemes. The same cascode principles can be added to the circuit of FIG. 3B.

Figure 5:
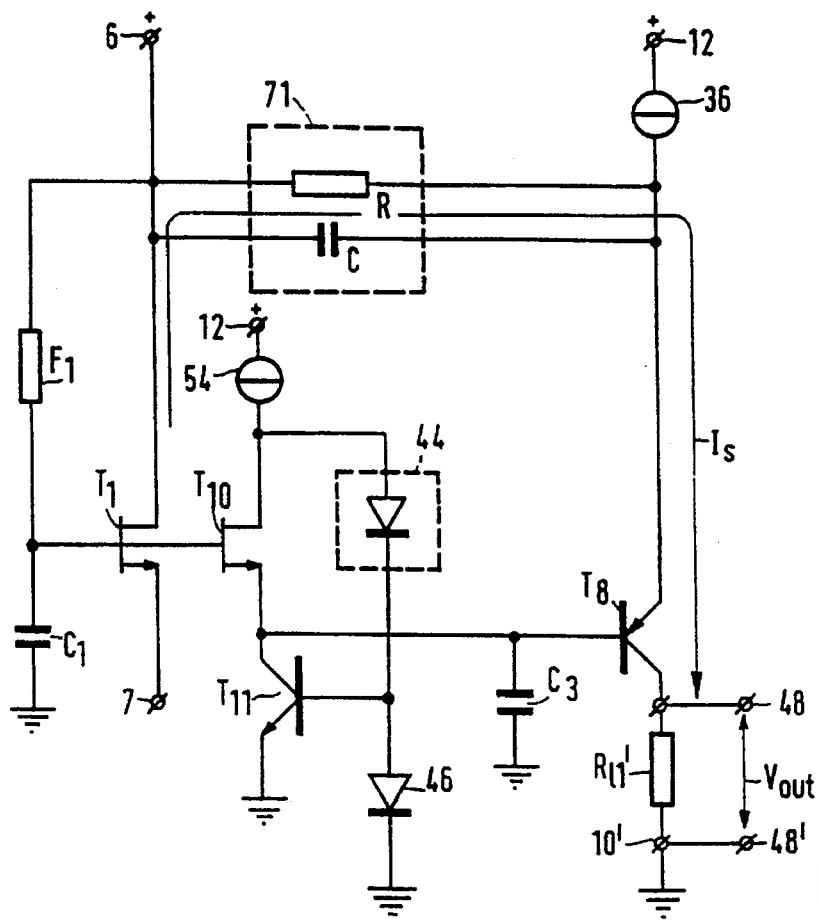

FIG. 5 shows another embodiment of the amplifier circuit. The amplifier circuit of FIG. 5 is a further elaboration of the circuit of FIG. 3B. Also in this case cascoding can be applied.

The amplifier circuit of FIG. 5 differs from the amplifier circuit of FIG. 3B in that, in addition to the elements included therein ($R_{R1}$ being replaced by $R_{R1}'$), it further comprises an impedance network 71. Further, a diode 46 and a capacitor element $C_3$ are present. An emitter terminal of the transistor $T_8$ is coupled to the terminal 6 of the amplifier circuit via the impedance network 71, as well as to an output terminal of the current source 36. The collector terminal of the transistor $T_8$ is coupled to a terminal of the load impedance $R_{l1}'$. From the Figure, it appears that the reference point 10 in FIG. 3B has now become the reference point 10', which has the same potential as the point 13 of constant potential, i.e., ground.

The base terminal of the transistor $T_{11}$ is coupled via the diode 46 to the point 13 of constant potential. The base terminal of the transistor $T_8$ is coupled to the first point 13 of constant potential via the capacitor element $C_3$.

Signal currents $I_s$ generated by the MR element $R_{m1}$ flow from the MR element to the terminal 7, via the transistor $T_1$, the impedance network 71 and the transistor $T_8$ to the load impedance $R_{l1}'$, the terminals 48, 48' now forming the output terminal of the arrangement. The capacitor element $C_3$ filters out a noise component that would otherwise be present in the output signal at the output terminal 48,48'.

It should be noted that the embodiments of the FIGS. 3A, 3B, 4A and 4B, where the output 8,8' of the amplifier circuit is connected to the terminals of the load impedance $R_4$, are particularly suitable for use in an arrangement provided with only one MR element $R_{m1}$. The embodiment of FIG. 5, where the output of the amplifier circuit is formed by the terminals 48,48' is particularly useful in an arrangement having two MR elements $R_{m1}$ and $R_{m2}$.

It should be further noted that the circuits of the FIGS. 3A, 3B, 4A and 4B could have been provided with a load impedance $R_{l1}'$ coupled between the collector of the transistor $T_8$ and the point 13 of constant potential, which is preferred for an arrangement having two MR elements.

Figure 6:
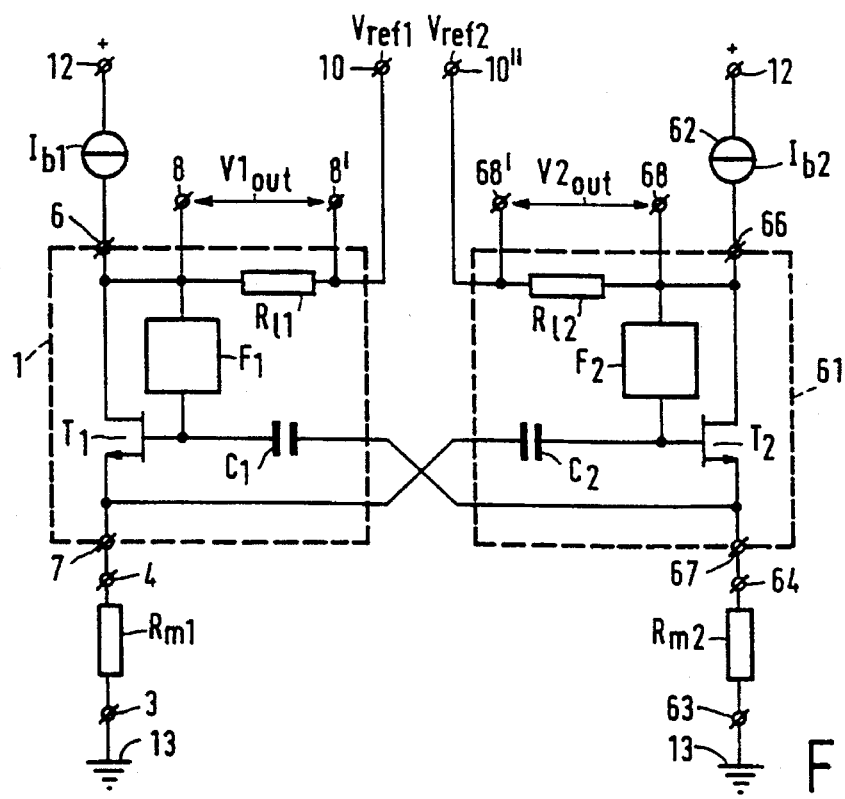
FIG. 6 shows a balanced arrangement according to the invention.

In arrangements provided with two MR elements $R_{m1}$ and $R_{m2}$, see the arrangement of FIG. 6, each MR element is coupled to an amplifier circuit of a type as described above. The output of such an arrangement is then formed by the terminals 48 of each of the two amplifier circuits.

FIG. 6 shows an embodiment of an arrangement which is in the form of a balanced circuit, and comprises two MR elements. The arrangement comprises a read head having a first and a second magneto-resistive element $R_{m1}$ and $R_{m2}$, respectively. Both MR elements $R_{m1}$ and $R_{m2}$ of the head scan the same track (not shown), so that they read the same signal from the track. The left hand part of the circuit shown in FIG. 6 is largely identical to the circuit diagram shown in FIG. 1.

A first terminal 63 of the MR element $R_{m2}$ is connected to the point 13 of constant potential (ground). Further, a second bias-current generator 62 is available, having an output for supplying a second bias current ($I_{b2}$), Another terminal of the bias-current generator 62 is coupled to the terminal 12, on which the positive supply voltage is available. The amplifier circuit 61 has a first terminal 66 coupled to the output of the second bias-current generator 62 and a second terminal 67 coupled to the second terminal 64 of the second magneto-resistive head $R_{m2}$. The second bias-current generator 62, the second amplifier circuit 61 and the second magneto-resistive element $R_{m2}$ form a series arrangement between the terminals 12 and 13.

The second amplifier circuit 61 comprises a transistor $T_2$, which is in the form of a MOS transistor, a load impedance $R_{l2}$, a feedback circuit $F_2$ and a capacitor element $C_2$. The source terminal of the transistor $T_2$ is coupled to the second terminal 67 of the amplifier circuit 61. The drain terminal of the transistor $T_2$ is coupled to the first terminal 66 of the amplifier circuit 61. The gate terminal of the transistor $T_2$ is coupled to the first terminal 66 of the amplifier circuit 61, via the feedback circuit $F_2$. Further, the gate terminal of the transistor $T_2$ is coupled to the source terminal of the transistor $T_1$ via the second capacitor element $C_2$. In addition, the gate terminal of the transistor $T_1$ is coupled to the source terminal of the transistor $T_2$ via the capacitor element $C_1$. It is also possible, however, to couple both capacitor elements to the point 13 of constant potential (ground). Nevertheless, the cross-coupled connection of the capacitor elements, as shown in FIG. 6, is preferred as it reduces the noise. A load impedance $R_{l2}$ is coupled between the terminal 66 of the amplifier circuit 61 and a reference point 10", on which point a reference voltage $V_{ref2}$ is available. The voltage $V_{ref2}$ may differ from the voltage $V_{ref1}$, as the DC voltages across the MR elements $R_{m1}$ and $R_{m2}$ can be different owing to mismatch of the resistance of the MR elements and/or unequal MR bias currents $I_{b1}$ and $I_{b2}$.

Constructions similar to the feedback circuits of the FIGS. 2A, 2B or 2C can be used for the feedback circuit $F_2$ of FIG. 6. It will further be clear that the amplifier circuits as shown in the FIGS. 3A, 3B, 4A, 4B and 5 can be used for the amplifier circuit 61 of FIG. 6.

It has been said previously that the two MR elements read a signal from the same track. When the two output signals $V_{1out}$ and $V_{2out}$ are added, an output signal which is the sum of both signals will appear, and systematic DC offset in both amplifier circuits 1 and 61 will cancel. This systematic DC offset is for example the term $V_{ch1}-V_{ch2}$ between the nodes 6 and 10 (FIG. 3A), discussed previously, or the DC voltage across the grounded load resistors, such as $R_{l1}'$ in FIG. 5.

Figure 7:
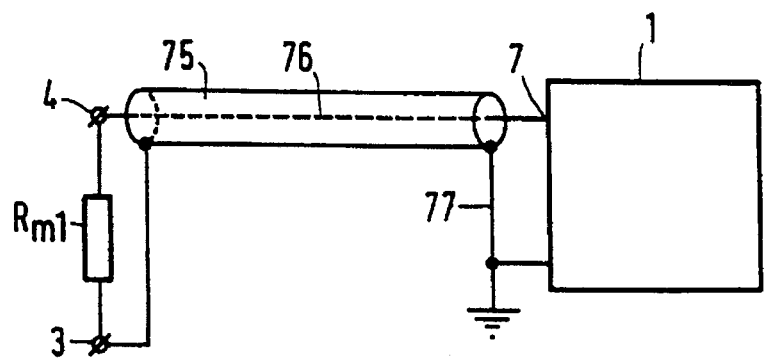
FIG. 7 shows an arrangement having shielding means provided over the electrical connection between the MR element and the amplifier circuit.

FIG. 7 shows a further improvement of the arrangement having only one MR element. FIG. 7 shows the provision of an electro-magnetic shielding 75 over the electrical connection 76 connecting the terminal 4 of the MR element $R_{m1}$ with the terminal 7 of the amplifier circuit 1. The shielding 75 is connected to ground via the electrical connection 77. This shielding prevents electro-magnetic stray fields from disturbing the signals read out by means of the head. The shielding can be realized by means of a kind of coaxial cable. However, simpler constructions can be used for the shielding means also, for instance by wrapping the ground conductor around the signal carrying conductor.

Figure 8:
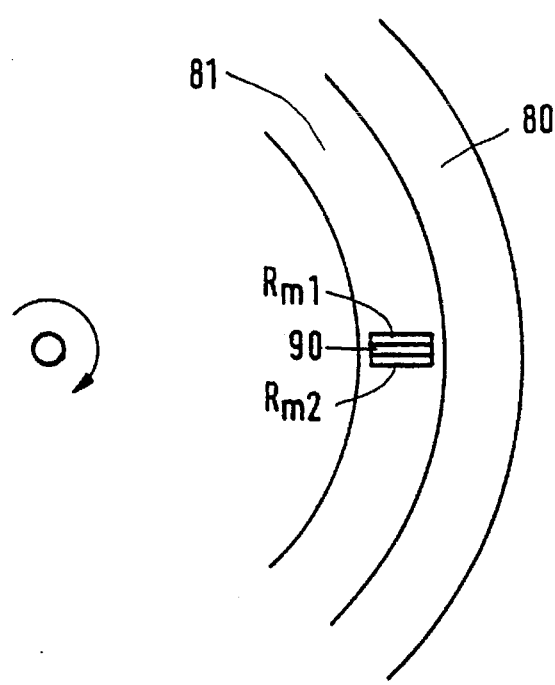
FIG. 8 shows the reading of information from a track on a disk shaped record carrier.

FIG. 8 shows a top view of the reading out of information from a track on a disk shaped record carrier 80 by means of a read head having two MR elements. Both MR elements $R_{m1}$ and $R_{m2}$ are coupled together via an insulating layer 90, and both read the full width of the same track 81.

The arrangements disclosed are preferably intended for hard disk applications, for low supply voltages, such as 3.3 V±10% and 5.0 V±10%. The bias current can be kept low, as the bias current is practically only needed for the MR element. A low-noise amplification of the signals read out can be obtained. The record carrier is preferably connected to ground via an electrical connection.

Figure 9A:
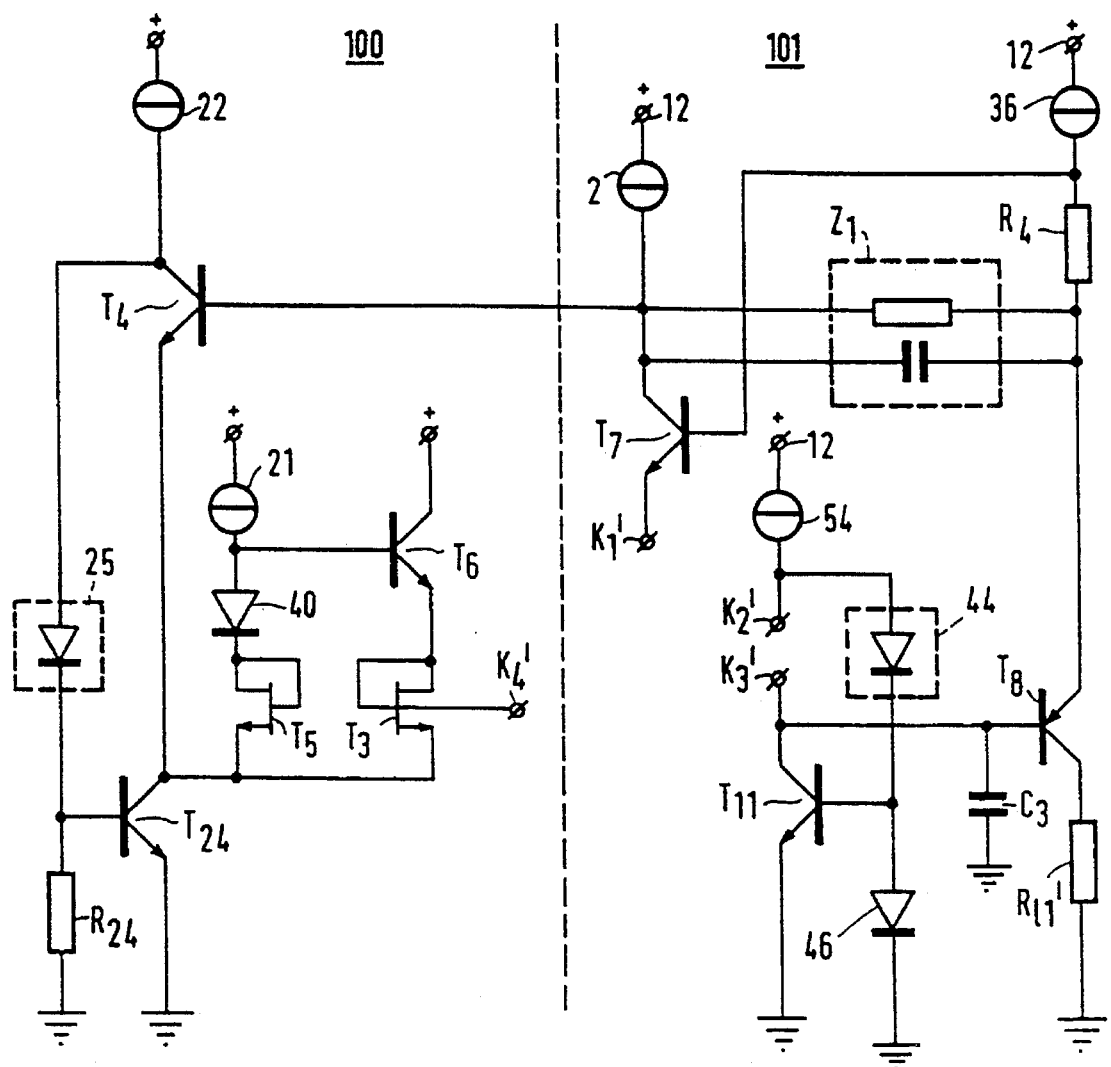
FIG. 9A and 9B show circuit parts that can be coupled together so as to realize a multiplexed read out by means of two or more separate MR elements.
Figure 9B:
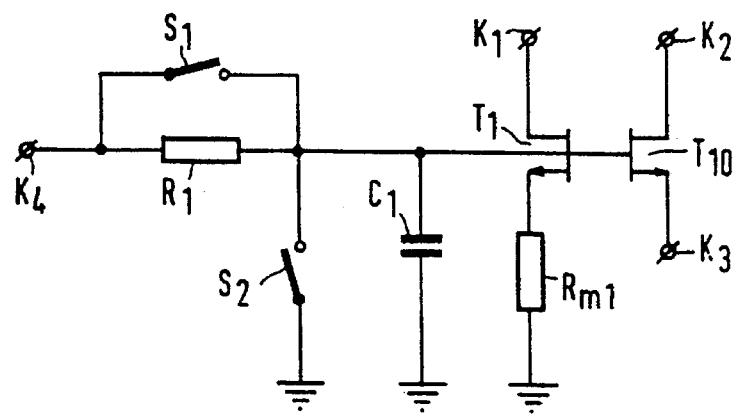

FIGS. 9A and 9B show units that can be coupled together in order to realize a multiplexed read out of information from a track on a record carrier by means of two or more MR elements. FIG. 9A shows the circuit part which is common to all MR elements, and FIG. 9B shows the circuit part for each MR element. Only one such circuit part for the MR element $R_{m1}$ is shown. For other MR elements, the circuit part of FIG. 9B should be copied. The common circuit part of FIG. 9A shows at the left side of the vertical broken line a circuit part indicated by the reference numeral 100, which circuit part is largely resembles the feedback circuit of FIG. 2C. It lacks the resistor $R_1$ and the switch $S_1$, which are included in the circuit part shown in FIG. 9B. At the right hand side of the broken line, the circuit part 101 largely resembles the amplifier circuits of FIG. 4A and 5.

Two or more of the circuits of FIG. 9B can be coupled to the common circuit of FIG. 9A by interconnecting the terminal $k_1'$ of the common circuit of FIG. 9A with the terminals $k_1$ of the two or more circuit parts of FIG. 9B. In the same way the terminals $k_2$ and $k_2'$, $k_3$ and $k_3'$, and $k_4$ and $k_4'$ are interconnected. Multiplexing is realized by means of the switches $S_2$ in each of the circuits of FIG. 9B. One of the switches $S_2$ of one of the circuits of FIG. 9B coupled to the common circuit of FIG. 9A, is opened and the switches $S_2$ of the other circuits of FIG. 9B are closed. In that situation, all of the MR elements $R_{m1}$ are switched off except one, so that the signal read by that MR element is applied to and amplified by the circuit part of FIG. 9A.

Figure 10:
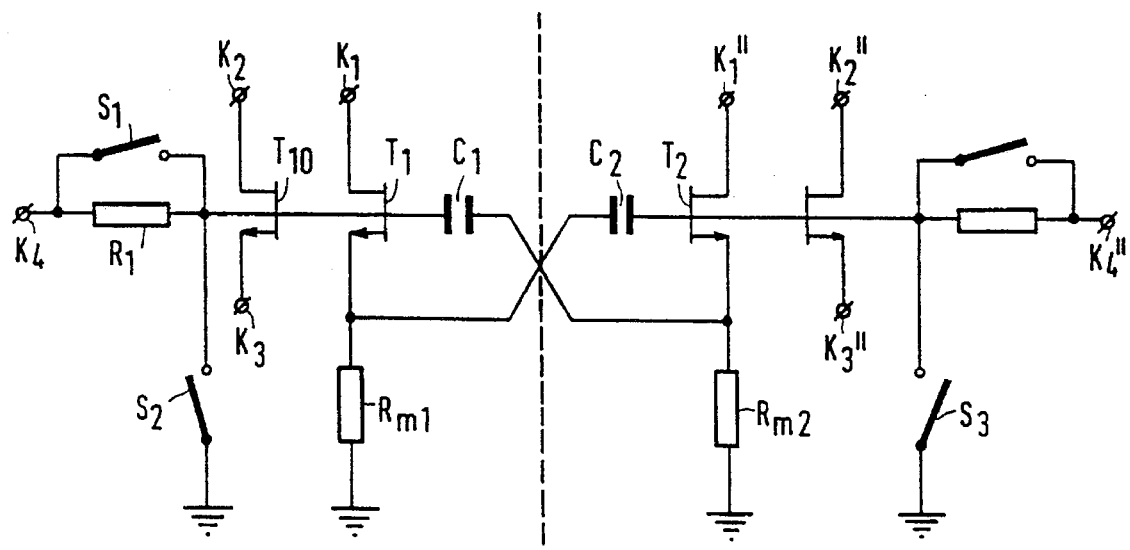
FIG. 10 shows the circuit part for realizing a multiplexed read out by means of two or more separate heads, each head having two MR elements.

FIG. 10 shows the circuit part of a balanced version of the head, comprising two MR elements $R_{m1}$ and $R_{m2}$, in a fashion as shown in FIG. 6, where multiplexing is made possible. FIG. 10 shows the circuit part including the two MR elements that is separate for each of the heads comprising two MR elements. The circuit part is largely mirror symmetrical, where the left hand part, left from the vertical broken line in FIG. 10, is the same as the circuit part of FIG. 9B. The circuit part of the transistors $T_1$ and $T_2$ and the capacitors $C_1$ and $C_2$ is identical to the corresponding circuit part of those elements in FIG. 6.

The circuit part of FIG. 9A is doubled, so as to obtain the common circuit part for each of the heads. The circuit part of FIG. 9A is thus coupled to the left hand part of the circuit of FIG. 10, as has been explained above for the interconnection between the circuits of FIG. 9A and 9B. The right hand circuit part of FIG. 10 is coupled to a circuit part identical to the circuit part of FIG. 9A. Switching the head of FIG. 10 into the circuit means that both switches $S_2$ and. $S_3$ are in the open position as shown. Consequently, the corresponding switches $S_2$ and $S_3$ of the other heads coupled to the common circuit are in their closed position. Switching the head off is realized by closing both switches $S_2$ and $S_3$.

Figure 11:
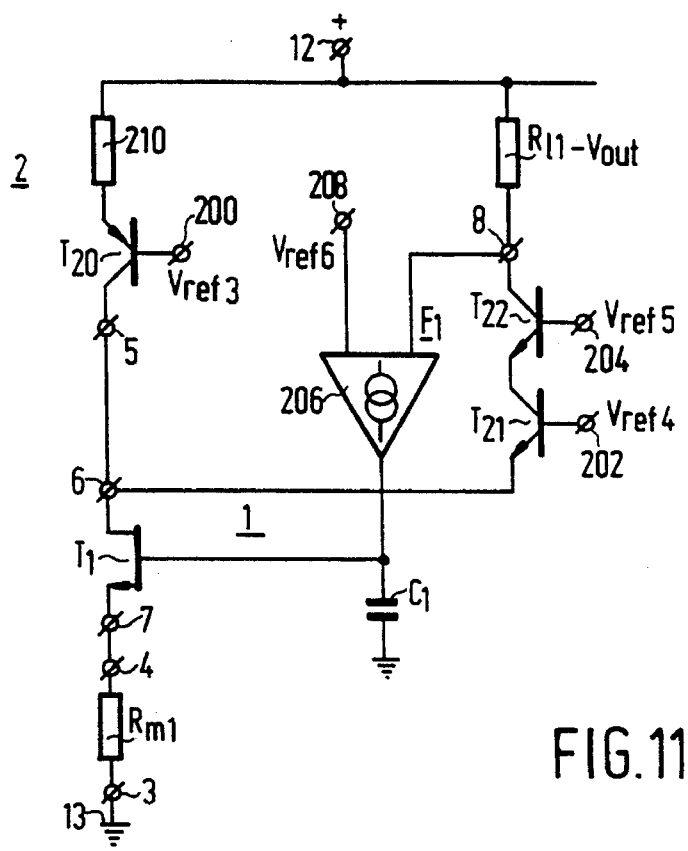
FIG. 11 shows an amplifier for use in the balanced arrangement according to the invention.

FIG. 11 shows an alternative further-elaborated version of the amplifier circuit 1 of FIG. 1. By way of example, the bias current generator 2 is implemented with a PNP transistor $T_{20}$, having the emitter coupled to the point of constant positive potential 12 via degeneration resistor 210, the base connected to a reference point 200 which supplies a reference voltage $V_{ref3}$ and the collector connected to the output 5 of the bias current generator 2. The first terminal 6 of the amplifier circuit 1 is directly connected to the output 5. However, in contradistinction to FIG. 1, the terminal 8, which interconnects the load impedance $R_{l1}$ and the feedback circuit $F_1$, is connected to the drain of the transistor $T_1$ via the collector-emitter path of a NPN transistor $T_{21}$. The emitter of transistor $T_{21}$ is connected to the drain of transistor $T_1$, the base is connected to a reference point 202 which supplies a reference voltage $V_{ref4}$ and the collector is coupled to the load impedance $R_{l1}$. The transistors $T_1$ and $T_2$ form a cascoded output stage. The collector of transistor $T_{21}$ may be connected to the load impedance $R_{l1}$ via the collector-emitter path of an optional further NPN cascode transistor $T_{22}$, the base of which further transistor $T_{22}$ is connected to a reference point 204 which supplies a reference voltage $V_{ref5}$. The feedback circuit: $F_1$ is a transconductance type stage 206 having differential voltage inputs connected to the terminal 8 and a reference point 208 which supplies a reference voltage $V_{ref6}$ and having a high-ohmic current output coupled to the gate of transistor $T_1$. The transconductance Gm of the transconductance stage 206 should have a low value as it determines the cut-off frequency of the feedback circuit $F_1$.

Transistor $T_{20}$ and emitter resistor 210 can be implemented with a programmable current output digital to analog converter (IDAC) for supplying the bias current of the magneto-resistive (MR) element. In the arrangement of FIG. 11 the IDAC supplies the variable part of the MR element's bias current, for instance 0 mA to 15.5 mA in steps of 0.5 mA, whereas a fixed current, for example 5 mA, is provided by the low-ohmic cascode output stage $T_{21}$. In order to obtain low noise, transistor $T_1$ should be large. The advantages of the arrangement of FIG. 11 are: (1) the large low-noise MOS transistor $T_1$ and the IDAC can have a low output impedance, since they feed their respective currents into a very low-ohmic emitter of the cascode transistor $T_{21}$; (2) the drain-to-gate capacitance of the large transistor $T_1$ is not Millered; (3) the IDAC provide lower bias current and a corresponding lower noise; and (4) the IDAC feeds its current to a low voltage node, which permits the value of emitter resistor 210 to increase, resulting in a further reduction of noise. It is to be noted that the bias current generator 2 can be omitted entirely, if only the fixed bias current supplied by the cascode output stage $T_{21}$ is sufficient to bias the MR element.

Figure 12:
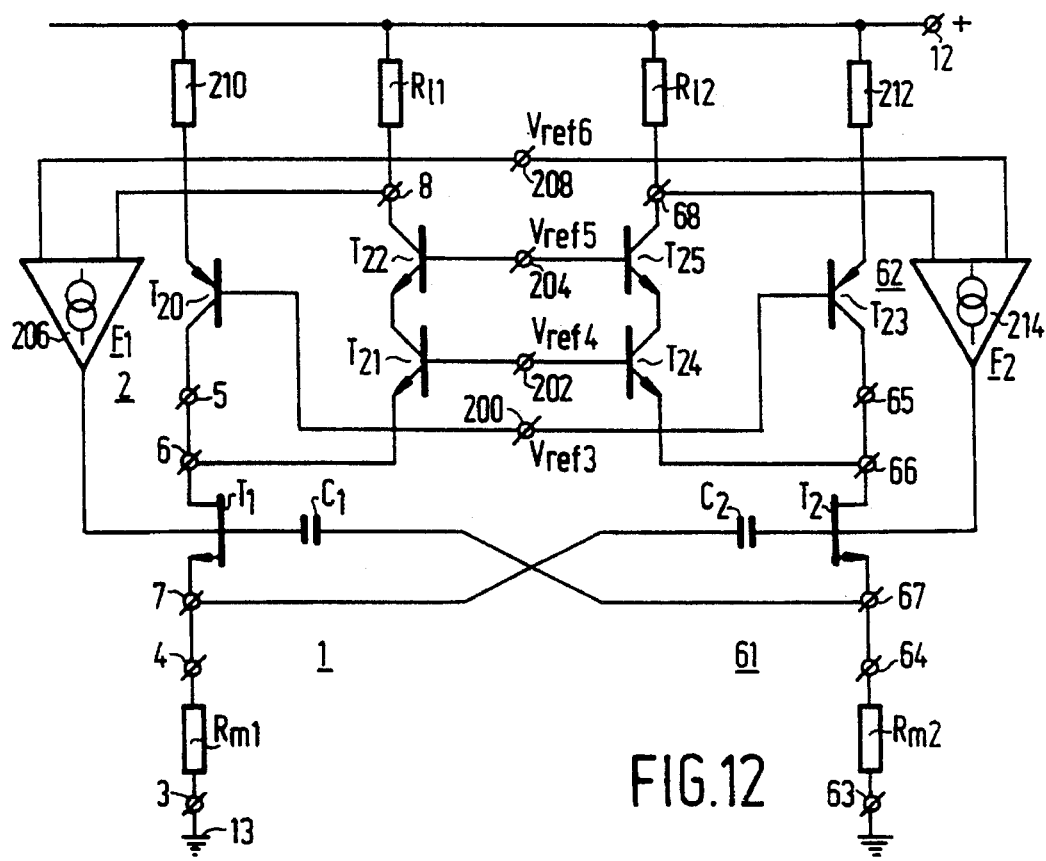
FIG. 12 shows an embodiment of a balanced arrangement according to the invention.

FIG. 12 shows a balanced version of the arrangement of FIG. 11. The two amplifiers 1 and 61, in particular the capacitors $C_1$ of the amplifier 1 and the corresponding capacitor $C_2$ of the second amplifier 61, are interconnected in a similar fashion as shown in FIG. 6. The degeneration resistor 212, the PNP transistor $T_{23}$, the NPN transistor $T_{24}$, the NPN transistor $T_{25}$ and the transconductance stage 214 of the second amplifier 61 correspond with the degeneration resistor 210, the PNP transistor $T_{20}$, the NPN transistor $T_{21}$, the NPN transistor $T_{22}$ and the transconductance stage 206 of the first amplifier 1 and are connected similarly. At high frequencies, the capacitors $C_1$ and $C_2$ form short circuits and place the gate-source paths of the transistors $T_1$ and $T_2$ anti-parallel. The same applies to the two individual equivalent noise resistors $R_n$ of the MOS transistors $T_1$ and $T_2$. The noise resistance $R_n$ is about equal to $R_o$, $R_o$ being the inverse of the transconductance of the transistors $T_1$ and $T_2$. The total effective noise resistance in the first amplifier 1 of the arrangement of FIG. 12 is $R_{m1}+R_o/2$ instead of $R_{m1}+R_o$ of the first amplifier 1 of the arrangement of FIG. 11. The balanced version thus provides a reduction of noise. One of the MR elements $R_{m1}$ or $R_{m2}$ may be omitted in single stripe MR read heads. In that case, terminal 7 or 67 is coupled to ground 13.

In the embodiments as shown in the Figures, certain transistors, for example the transistors $T_1$, $T_2$, $T_3$, $T_5$ and $T_{10}$ are preferably unipolar MOS transistors; other transistors, such as the transistors $T_4$, $T_{24}$, $T_6$, $T_7$, $T_8$, $T_9$, $T_{11}$ and $T_{21}$, are preferably bipolar transistors. It is, however, possible to use bipolar transistors instead of unipolar transistors and vice versa, or to use only bipolar or only unipolar transistors. The first main flow terminal, the second main flow terminal and the control terminal of a transistor correspond to, respectively, the source terminal, the drain terminal and the gate terminal of an unipolar transistor and to, respectively, the emitter terminal, the collector terminal and the base terminal of a bipolar transistor.

We claim:

1. An arrangement for reading out an information signal from a magnetic record carrier, comprising:

a read head including a magneto-resistive element having a first terminal connected to a first point of constant potential, and a second terminal;

first bias-current means for supplying a first bias-current, the first bias-current means having a first terminal coupled to a second point of constant potential, and a second terminal;

a first amplifier circuit having an output terminal for supplying the information signal, a first terminal coupled to the second terminal of the first bias-current means, and a second terminal coupled to the second terminal of the magneto-resistive element, whereby the first bias-current-means, the first amplifier circuit and the magneto-resistive element are in series with one another in that order between the second point of constant potential and the first point of constant potential, the first terminal of the first amplifier circuit further being coupled to the output terminal of the first amplifier circuit, and the first amplifier circuit including a first transistor, a first feedback circuit, a first load impedance and a first capacitor element, a first main flow terminal of the first transistor being connected to the second terminal of the first amplifier circuit, a second main flow terminal of the first transistor being coupled to the first terminal of the first amplifier circuit, a control terminal of the first transistor ($T_1$) being coupled to the output terminal of the first amplifier circuit via the first feedback circuit, and the first load impedance being coupled between the output terminal of the first amplifier circuit and a first reference voltage terminal;

second bias-current means for supplying a second bias-current, the second bias-current means having a first terminal coupled to the second point of constant potential, and a second terminal; and a second amplifier circuit having an output terminal, a first terminal coupled to the second terminal of the second bias-current means, and a second terminal coupled to the first point of constant potential, whereby the second bias-current means, and the second amplifier circuit are in series with one another in that order between the second point of constant potential and the first point of constant potential, the first terminal of the second amplifier circuit further being coupled to the output terminal of the second amplifier circuit, and the second amplifier circuit including a second transistor, a second feedback circuit, a second load impedance and a second capacitor element, a first main flow terminal of the second transistor being connected to the second terminal of the second amplifier circuit, a second main flow terminal of the second transistor being coupled to the first terminal of the second amplifier circuit, a control terminal of the second transistor being coupled to the output terminal of the second amplifier circuit via the second feedback circuit, and the second load impedance being coupled between the output terminal of the second amplifier circuit and a second reference voltage terminal;

wherein the control terminal of the second transistor is coupled to the second terminal of the first amplifier circuit via the second capacitor element, and the control terminal of the first transistor is coupled to the second terminal of the second amplifier circuit via the first capacitor element.

2. The arrangement as claimed in claim 1, wherein the first terminal of the first amplifier circuit is coupled to the output terminal of the first amplifier circuit via a first cascode transistor having an first main flow terminal connected to the first terminal of the first amplifier circuit, and a second main flow terminal coupled to the output terminal of the first amplifier circuit; and the first terminal of the second amplifier circuit is coupled to the output terminal of the second amplifier circuit via a second cascode transistor having an first main flow terminal connected to the first terminal of the second amplifier circuit, and a second main flow terminal coupled to the output terminal of the second amplifier circuit.

3. The arrangement as claimed in claim 2, wherein the second main flow terminal of the first cascode transistor is coupled to the output terminal of the first amplifier circuit via a first further cascode transistor having a first main flow terminal connected to the second main flow terminal of the first cascode transistor, and a second main flow terminal connected to the output terminal of the first amplifier circuit; and the second main flow terminal of the second cascode transistor is coupled to the output terminal of the second amplifier circuit via a second further cascode transistor having a first main flow terminal connected to the second main flow terminal of the second cascode transistor, and a second main flow terminal connected to the output terminal of the second amplifier circuit.

4. The arrangement as claimed in claim 3, wherein the first feedback circuit includes a first transconductance stage having differential voltage inputs coupled to the output terminal of the first amplifier circuit and a further reference voltage terminal, and a current output terminal coupled to the control terminal of the first transistor; and the second feedback circuit includes a second transconductance stage having differential voltage inputs coupled to the output terminal of the second amplifier circuit and the further reference voltage terminal, and a current output terminal coupled to the control terminal of the second transistor.

5. The arrangement as claimed in claim 4, wherein at least one of the first bias-current means and the second bias-current means includes a bias-current generator having an output connected to the first terminal of the amplifier circuit to which the second terminal of that at least one bias-current means is coupled.

6. The arrangement as claimed in claim 5, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

7. The arrangement as claimed in claim 1, wherein the first feedback circuit includes:

a voltage buffer having an input coupled to an input terminal of the first feedback circuit, and an output;

a first series resistor connected between the output of the voltage buffer and an output terminal of the first feedback circuit; and a switch connected in parallel with the first series resistor and operable in response to a control signal.

8. The arrangement as claimed in claim 7, wherein the voltage buffer includes a first current source, a second current source, a third transistor and a fourth transistor, a first main flow terminal of the third transistor and a first main flow terminal of the fourth transistor being interconnected and coupled to the first point of constant potential via the first current source, a second main flow terminal of the third transistor being connected to a control terminal of the third transistor and coupled to the second point of constant potential via the second current source and forming the output of the voltage buffer, a second main flow terminal of the fourth transistor being coupled to the second point of constant potential, and a control terminal of the fourth transistor forming the input of the voltage buffer.

9. The arrangement as claimed in claim 8, wherein the voltage buffer further includes a third current source connected between the second main flow terminal of the fourth transistor and the second point of constant potential; and the first current source includes a diode arrangement, a bias resistor and a fifth transistor having a first main flow terminal connected to the first point of constant potential, a second main flow terminal connected to the first main flow terminals of the third and fourth transistors, and a control terminal coupled to the second main flow terminal of the fourth transistor via the diode arrangement and to the first point of constant potential via the bias resistor.

10. The arrangement as claimed in claim 9, wherein the voltage buffer further includes a diode element; a sixth transistor having a control terminal and a second main flow terminal interconnected and coupled to the second current source via the diode element, and a first main flow terminal connected to the first main flow terminal of the third transistor; and a seventh transistor having a first main flow terminal coupled to the second main flow terminal of the third transistor, a second main flow terminal coupled to the second point of constant potential, and a control terminal coupled to the second main flow terminal of the sixth transistor via the diode element.

11. The arrangement as claimed in claim 10, wherein the first amplifier circuit further includes an eighth transistor having a first main flow terminal connected to the second main flow terminal of the first transistor, and a second main flow terminal coupled to the first terminal of the first amplifier circuit.

12. The arrangement as claimed in claim 11, wherein the first amplifier circuit further includes a bias-current source, and a ninth transistor having a control terminal coupled to the second terminal of the first amplifier circuit, a first main flow terminal coupled to the second point of constant potential via the bias-current source, and a second main flow terminal coupled to the first point of constant potential; and wherein the first load impedance is coupled between the output terminal of the first amplifier circuit and the first main flow terminal of the ninth transistor.

13. The arrangement as claimed in claim 12, wherein the first amplifier circuit further includes a tenth transistor having a first main flow terminal coupled to a control terminal of the eighth transistor, and a control terminal coupled to the first main flow terminal of the ninth transistor.

14. The arrangement as claimed in claim 13, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

15. The arrangement as claimed in claim 7, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

16. The arrangement as claimed in claim 7, wherein the first amplifier circuit further includes a third transistor having a first main flow terminal connected to the second main flow terminal of the first transistor, and a second main flow terminal coupled to the first terminal of the first amplifier circuit.

17. The arrangement as claimed in claim 16, wherein the first amplifier circuit further includes a bias-current source, and a fourth transistor having a control terminal coupled to the second terminal of the first amplifier circuit, a first main flow terminal coupled to the second point of constant potential via the bias-current source, and a second main flow terminal coupled to the first point of constant potential; and wherein the first load impedance is coupled between the output terminal of the first amplifier circuit and the first main flow terminal of the fourth transistor.

18. The arrangement as claimed in claim 17, wherein the first amplifier circuit further includes a fifth transistor having a first main flow terminal coupled to a control terminal of the third transistor, and a control terminal coupled to the first main flow terminal of the fourth transistor.

19. The arrangement as claimed in claim 16, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

20. The arrangement as claimed in claim 7, wherein the first amplifier circuit further includes a bias-current source, and a third transistor having a control terminal coupled to the second terminal of the first amplifier circuit, a first main flow terminal coupled to the second point of constant potential via the bias-current source, and a second main flow terminal coupled to the first point of constant potential; and wherein the first load impedance is coupled between the output terminal of the first amplifier circuit and the first main flow terminal of the third transistor.

21. The arrangement as claimed in claim 20, further comprising a further load impedance having a terminal for providing a further information signal, and wherein the second main flow terminal of the third transistor is coupled to the first point of constant potential via the further load impedance.

22. The arrangement as claimed in claim 20, wherein the first amplifier circuit further includes a fourth transistor having a control terminal coupled to the control terminal of the first transistor, and a first main flow terminal coupled to the control terminal of the third transistor.

23. The arrangement as claimed in claim 22, further comprising a further load impedance having a terminal for providing a further information signal, and wherein the second main flow terminal of the third transistor is coupled to the first point of constant potential via the further load impedance.

24. The arrangement as claimed in claim 20, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

25. The arrangement as claimed in claim 1, wherein the first feedback circuit includes a first transconductance stage having differential voltage inputs coupled to the output terminal of the first amplifier circuit and a further reference voltage terminal, and a current output terminal coupled to the control terminal of the first transistor; and the second feedback circuit includes a second transconductance stage having differential voltage inputs coupled to the output terminal of the second amplifier circuit and the further reference voltage terminal, and a current output terminal coupled to the control terminal of the second transistor.

26. The arrangement as claimed in claim 1, wherein at least one of the first bias-current means and the second bias-current means includes a bias-current generator having an output connected to the first terminal of the amplifier circuit to which the second terminal of that at least one bias-current means is coupled.

27. The arrangement as claimed in claim 1, further comprising an additional magneto-resistive element having a first terminal connected to the first point of constant potential, and a second terminal coupled to the second terminal of the second amplifier circuit, whereby the second bias-current means, the second amplifier circuit and the additional magneto-resistive element are in series with one another in that order between the second point of constant potential and the first point of constant potential.

28. An arrangement for reading out an information signal from a magnetic record carrier, comprising:

read means for reading the information signal;

a first amplifier coupled to the read means and having an output terminal, the first amplifier including
a first transistor having a control terminal, a first main flow terminal coupled to the read means, and a second main flow terminal coupled to the output terminal of the first amplifier; and
a first feedback means for providing feedback from the output terminal of the first amplifier to the control terminal of the first transistor, the first feedback means having a first cut-off capacitor coupled to the control terminal of the first transistor; and a second amplifier, which is substantially the same as the first amplifier, coupled to the first amplifier and having an output terminal, the second amplifier including
a second transistor having a control terminal, a first main flow terminal, and a second main flow terminal coupled to the output terminal of
the second,amplifier; and a second feedback means for providing feedback from the output terminal of the second amplifier to the control terminal of the second transistor, the second feedback means having a second cut-off capacitor coupled to the control terminal of the second transistor;

wherein the first cut-off capacitor is further coupled to the first main flow terminal of the second transistor, and the second cut-off capacitor is further coupled to the first main flow terminal of the first transistor.

29. The arrangement as claimed in claim 28, wherein the first cut-off capacitor has a first terminal coupled to the control terminal of the first transistor, and a second terminal coupled to coupled to the first main flow terminal of the second transistor; and the second cut-off capacitor has a first terminal coupled to the control terminal of the second transistor, and a second terminal coupled to coupled to the first main flow terminal of the first transistor.

30. The arrangement as claimed in claim 28, wherein said first main flow terminal of the second transistor is further coupled to the read means.

31. The arrangement as claimed in claim 30, wherein said read means includes a first magneto-resistive element which is coupled to the first main flow terminal of the first transistor, and a second magneto-resistive element which is coupled to the first main flow terminal of the second transistor.

* * * * *